(12) United States Patent
Choi

(10) Patent No.: US 7,276,931 B1
(45) Date of Patent: Oct. 2, 2007

(54) SYSTEM AND METHOD FOR CREATING REPLACEMENTS FOR OBSOLETE COMPUTER CHIPS

(76) Inventor: In Young Choi, 20 Traverse Dr., Plymouth Meeting, PA (US) 19462

( * ) Notice: Subject to any disclaimer, the term of this patent is extended or adjusted under 35 U.S.C. 154(b) by 175 days.

(21) Appl. No.: 11/089,250

(22) Filed: Mar. 25, 2005

(51) Int. Cl.
*H03K 19/003* (2006.01)
*H03K 19/173* (2006.01)

(52) U.S. Cl. .......................................... 326/10; 326/38

(58) Field of Classification Search ............ 326/37–39, 326/41, 47, 10
See application file for complete search history.

(56) References Cited

U.S. PATENT DOCUMENTS

| | | | | |
|---|---|---|---|---|
| 5,321,827 A | | 6/1994 | Lu et al. .................... | 395/500 |
| 6,120,551 A | * | 9/2000 | Law et al. .................... | 716/17 |
| 6,314,551 B1 | * | 11/2001 | Borland ....................... | 716/17 |
| 6,625,796 B1 | * | 9/2003 | Rangasayee et al. .......... | 716/17 |

\* cited by examiner

*Primary Examiner*—James H. Cho
(74) *Attorney, Agent, or Firm*—LaMorte & Associates

(57) ABSTRACT

A system and method for replacing a malfunctioning logic device with a substitute logic device. The system provides a replacement assembly that contains a complex programmable logic device, a programming port and a pin configuration. The pin configuration selected matches the pin configuration of the malfunctioning logic device being replaced. The programming port on the replacement assembly is attached to a computer. Using software on the computer, the complex programmable logic device can be programmed with the same logic functions as were present within the malfunctioning logic device. Consequently, a single replacement assembly can be used to replace hundreds of different types of logic devices. This provided a cost efficient manner to produce replacements for obsolete logic devices that are no longer commercially available.

12 Claims, 3 Drawing Sheets

SYSTEM AND METHOD FOR CREATING REPLACEMENTS FOR OBSOLETE COMPUTER CHIPS

BACKGROUND OF THE INVENTION

1. Field of the Invention

In general, the present invention relates to systems and methods of programming computer chips. More particularly, the present invention relates to systems and methods that enable new computer chips to be programmed with the functions already programmed on obsolete computer chips so that the obsolete computer chips can be replaced.

2. Prior Art Description

In the field of circuit design, circuits are continually being made smaller, faster and cheaper. In such an environment, the functional life of any logic device containing such circuits is limited. It is therefore not unusual for certain logic devices to become obsolete within a year's time.

As electronic assemblies are built, logic devices are typically used in the designed circuitry. If a logic device fails, the logic device must then be replaced in order for the circuitry of the electronic assembly to again work properly. The problem is that a logic device may fail years after its manufacture. During that time, the logic devices have become obsolete and replacements are no longer commercially available.

Once a logic device becomes obsolete and is no longer manufactured, it becomes very difficult to replace that logic device. As a logic device is phased out of production, a manufacturer typically makes a final run to produce a reservoir of spare pieces. Over time, this reservoir dwindles until a particular logic device is simply no longer available. In order to produce the obsolete logic device, either, the logic device must be custom manufactured or it must be scavenged from other equipment. This makes the replacement parts very difficult and expensive to obtain. Furthermore, many electronic systems contain hundreds, if not thousands, of separate logic devices. Over time, most all of these logic devices will become obsolete. So in order to overhaul an old electronic system, replacements for a great many different logic devices must be found.

Often the problem of obsolete parts can be solved by either buying more modern equipment or updating an old electronic assembly with new circuit boards that contain new logic devices. However, in many circumstances, these options are not available. Many electronic systems, such as those used on military ships and aircraft, are custom designed. It would cost many millions of dollars to replace or update such dedicated systems. Thus, such systems must be maintained by finding replacement parts, even though those replacement parts are obsolete. It is therefore not unusual to spend hundreds of dollars replacing obsolete logic devices that originally cost only a few cents.

In the prior art, there are many systems and methods for upgrading obsolete components. This is typically done by making modular circuit boards that are designed to receive upgraded logic devices over time. Such prior art systems are exemplified by U.S. Pat. No. 5,321,827 to Lu, entitled Computer System With Modular Upgrade Capability. However, if a circuit board is not manufactured with such a modular design, working substitutes for the obsolete logic components must be located when the logic components fail.

A need therefore exists for a system and method to produce replacements for obsolete logic devices, wherein the replacement devices can be produced very inexpensively and in a great variety. This need is met by the present invention as described and claimed below.

SUMMARY OF THE INVENTION

The present invention is a system and method for replacing a malfunctioning logic device with a substitute logic device. The system provides a replacement assembly that contains a complex programmable logic device, a programming port and a pin configuration. The pin configuration selected matches the pin configuration of the malfunctioning logic device that is being replaced. In this manner, the replacement assembly can be attached to a circuit board in the exact same position, as was the malfunctioning logic device.

The complex programmable logic device within the replacement assembly is originally unprogrammed. To program the complex programmable logic device, the programming port on the replacement assembly is attached to a computer. Using software on the computer, the complex programmable logic device can be programmed with the same logic functions as were present within the malfunctioning logic device. Consequently, a single replacement assembly can be used to replace hundreds of different types of logic devices. This provided a cost efficient manner to produce replacements for obsolete logic devices that are no longer commercially available.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE DRAWINGS

Although the present invention system and method can be used to create many types of logic devices, the exemplary embodiment describes a system and method for producing replacement logic devices for 74LS series and 54LS series of digital logic devices. 74LS and 54LS series logic devices are 5-volt Transistor Transistor Logic (TTL) devices, that have been manufactured by many different commercial computer chip companies. The 74LS series logic devices are used in the commercial temperature environment and are manufactured with a plastic packaging. The 54LS series logic devices are used in the military temperature environment and are manufactured in ceramic packaging. Otherwise, the 74LS series logic devices are functionally identical to the corresponding 54LS series logic devices.

Both the 74LS series logic devices and the 54LS logic devices have a 14, 16 or 20 pin dual in line configuration. The complexity of the logic function contained within the logic device typically determines the number of pins the package will have.

Although the exemplary embodiment will specifically address logic devices, such as the 74LS and 54LS series logic devices, it should be understood that the present invention system and method can be used to produce replacement logic devices for most any five-volt TTL logic device. The 74LS and 54LS series logic devices were selected as being an example of a logic device that is commonly known and is in wide use.

Figure 1:
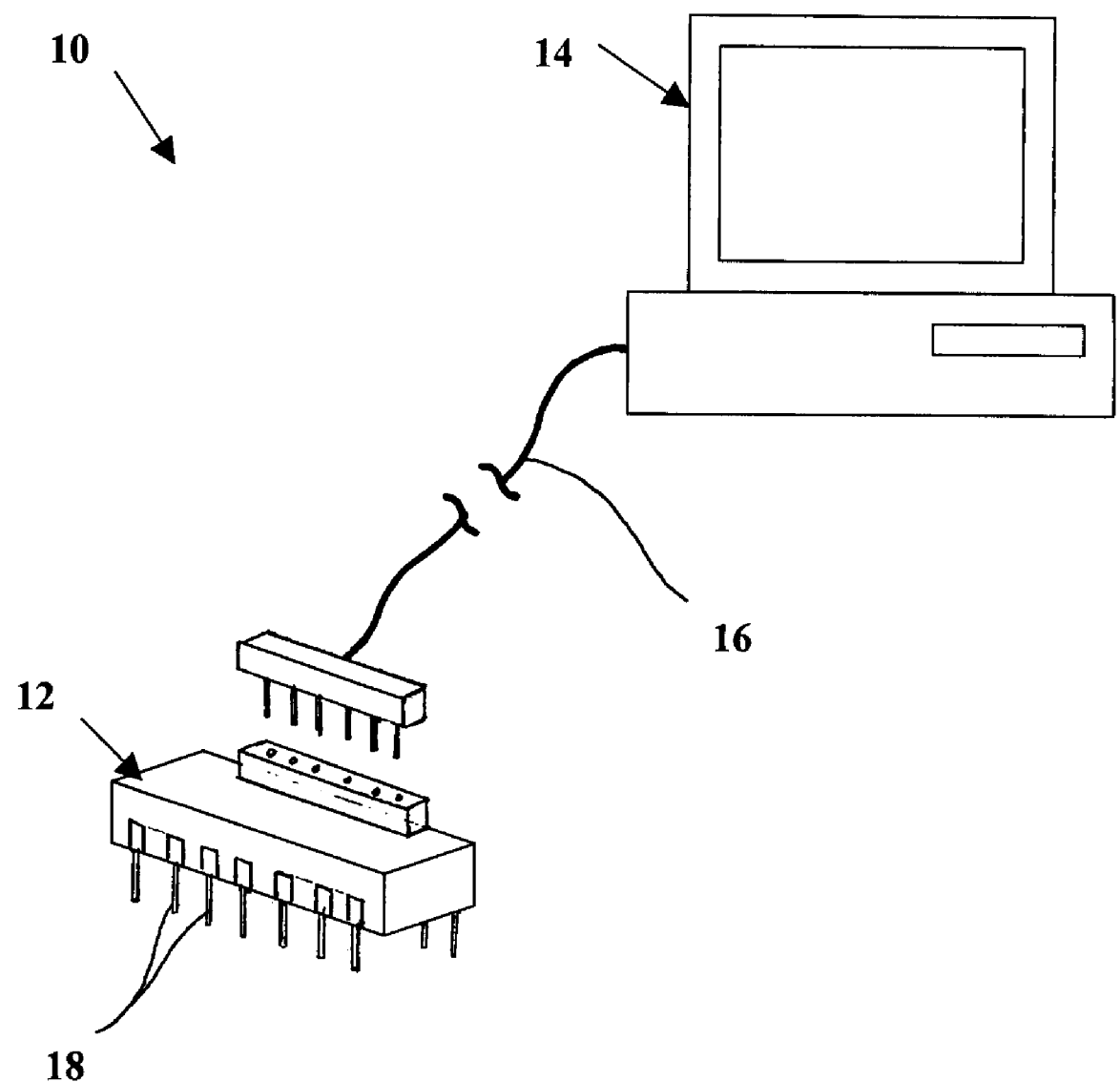
FIG. 1 shows the hardware components of an exemplary embodiment of the present invention system.

Referring to FIG. 1, a system 10 is shown for creating a replacement to an obsolete TTL logic device. The system 10 includes a replacement assembly 12, a computer 14 and an interface cable 16 that enables the computer 14 to be selectively attached to the replacement assembly 12. The computer 14 can be a personal computer of most any make and model that is capable of supporting the appropriate programming software. The computer 14 is loaded with software, such as Webpack™, that allows a user to write in Very High Speed Integrated Circuit Hardware Description Language (VHDL). VHDL programming language is the standard language used in the development and testing of programmable logic devices.

The replacement assembly 12 has pins 18. The number of pins 18 present on the replacement assembly 12 depends upon the logic device that is being replaced. In industry, the 74LS series of logic devices typically has fourteen, sixteen or twenty pins. Accordingly, in the exemplary embodiment, the replacement assembly 12 will have either fourteen pins, sixteen pins or twenty pins, since it is being used to replace a 74LS series logic device. The replacement assembly 12 also includes a programming port 20 that enables the replacement assembly 12 to be selectively attached to the interface cable 16 and, thus, the computer 14.

As will be further detailed, the replacement assembly 12 contains a complex programmable logic device (CPLD) that is not programmed. When the replacement assembly 12 is attached to the computer 14 with the interface cable 16, the CPLD within the replacement assembly 12 can be programmed to a specific logic configuration using the VHDL programming language.

In the exemplary embodiment, the replacement assembly 12 is configured to replace a 74LS series or 54LS series logic device. In industry, the 74LS series logic devices are programmed with hundreds of logic functions. A table showing some of those functions, with pin number and industry part number are provided below in Table I.

TABLE I

| Industry No. | Pins | Logic Function |
|---|---|---|
| 74LS00 | 14 | Quad 2-input NAND gate |
| 74LS01 | 14 | Quad 2-input NAND gate (O.C.) |
| 74LS02 | 14 | Quad 2-input NOR gate |
| 74LS03 | 14 | Quad 2-input NAND gate |
| 74LS04 | 14 | Hex inverter |
| 74LS05 | 14 | Hex inverter (O.C.) |
| 74LS06 | 14 | Hex inverter buffer/driver |
| 74LS07 | 14 | Hex buffer/driver (O.C.) |
| 74LS08 | 14 | Quad 2-input AND gate |
| 74LS09 | 14 | Quad 2-input AND gate (O.C.) |
| 74LS10 | 14 | Triple 3-input NAND gate |
| 74LS11 | 14 | Triple 3-input AND gate |
| 74LS12 | 14 | Triple 3-input NAND gate |
| 74LS13 | 14 | Dual 4-input NAND schmitt trigger |
| 74LS14 | 14 | Hex inverter schmitt trigger |
| 74LS15 | 14 | Triple 3-input AND gate |
| 74LS20 | 14 | Dual 4-input pos. NAND gate |
| 74LS21 | 14 | Dual 4-input pos. AND gate |
| 74LS26 | 14 | Quad 2-input NAND gate (O.C.) |
| 74LS27 | 14 | Triple 3-input pos. NOR gate |
| 74LS30 | 14 | 8-input pos. NAND gate |
| 74LS32 | 14 | Quad 2-input pos. OR gate |
| 74LS33 | 14 | Quad 2-input pos. NOR buffer (O.C.) |
| 74LS37 | 14 | Quad 2-input pos. NAND buffer |
| 74LS38 | 14 | Quad 2-input pos. NAND buffer (O.C.) |

TABLE I-continued

| Industry No. | Pins | Logic Function |
|---|---|---|
| 74LS40 | 14 | Dual 4-input pos. NAND buffer |
| 74LS42 | 16 | BCD-to-dec. decoder |
| 74LS47 | 16 | BCD-to-7 Seg.decoder/driver (15vout) |
| 74LS48 | 16 | BCD-to-7 Seg. decoder/driver |
| 74LS51 | 14 | Dual 2-wide2-inputAND-OR-INVERTgate |
| 74LS54 | 14 | 4-wide 2-input AND-OR-INVERT gate |
| 74LS55 | 14 | 2-wide 4-in. AND/OR INVERT gate |
| 74LS73 | 14 | Dual JK flip-flop with clear |
| 74LS74 | 14 | Dual D-type flip-flopw/preset |
| 74LS75 | 16 | 4-bit bistable latch |
| 74LS76 | 16 | Dual JK flip-flop w/preset and clr. |
| 74LS83 | 14 | 4-bit binary full adder |
| 74LS85 | 16 | 4-bit magnitude comparator |
| 74LS86 | 14 | Quad 2-input XOR gate |
| 74LS90 | 14 | Decade counter |
| 74LS91 | 14 | 8-bit shift register |
| 74LS92 | 14 | Divide-by-12 counter |
| 74LS93 | 14 | 4-bit binary counter |
| 74LS95 | 14 | 4-bit par-access shift register |
| 74LS96 | 16 | 5-bit shift register |
| 74LS107 | 14 | Dual JK flip-flop with clear |
| 74LS109 | 16 | Dual JK pos. edge trig. F.F. |
| 74LS112 | 16 | Dual JK edge-trig. flip-flop |
| 74LS113 | 14 | Dual JK edge-trig. flip-flop |
| 74LS122 | 14 | Retrig. monostable multivibrator |
| 74LS123 | 16 | Dual retrig. MS multivibrator |
| 74LS125 | 14 | Quad 3-state bus buffer |
| 74LS126 | 14 | Quad 3-state bus butter |
| 74LS132 | 14 | Quad 2-in-pos. NAND schmitt trigger |
| 74LS133 | 16 | 13-input NAND gate |
| 74LS136 | 14 | Quad 2-input XOR gate (O.C.) |
| 74LS138 | 16 | 3-to-8 line decoder/demux |
| 74LS139 | 16 | Dual 2-to-4 decoder/demux |
| 74LS145 | 16 | BCD-to-dec. decoder/driver |
| 74LS147 | 16 | 10-to-4 priority encoder |
| 74LS148 | 16 | 8-to-3 priority encoder |
| 74LS151 | 16 | 8-channel dig. multiplexer |
| 74LS153 | 16 | Dual 4-to-1 multiplexer |
| 74LS154 | 24 | 4-to-16 decoder/demux |
| 74LS155 | 16 | Dual 2-to-4 decoder/demux |
| 74LS156 | 16 | Dual 2-to-4 decoder/demux |
| 74LS157 | 16 | Quad 2-to-1 data selector/mux |
| 74LS158 | 16 | Quad 2-to-1 data select/mux |
| 74LS160 | 16 | BCD decade counter |
| 74LS161 | 16 | 4-Bit binary counter |
| 74LS162 | 16 | BCD decade counter |
| 74LS163 | 16 | 4-bit binary counter |
| 74LS164 | 14 | 8-bit par-out serial shift register |
| 74LS165 | 16 | 8-bit par.load serial shift reg. |
| 74LS166 | 16 | 8-bit par. load shift register |
| 74LS169 | 16 | 4-bit up/down synchr binary counter |
| 74LS170 | 16 | 4 x 4 register file |
| 74LS173 | 16 | 4-bit D-type register 3-state |
| 74LS174 | 16 | Hex D flip-flop with clear |
| 74LS175 | 16 | Quad D flip-flop with clear |
| 74LS181 | 24 | Arithmetic logic unit |
| 74LS189 | 16 | 16 x 4 static ram 3-state |
| 74LS190 | 16 | BCD/decade up/down counter |
| 74LS191 | 16 | 4-bit binary up/down counter |
| 74LS192 | 16 | BCD/decade up/down counter |
| 74LS193 | 16 | 4-bit binary up/down counter |
| 74LS194 | 16 | 4-bit bi-directional shift register |
| 74LS195 | 16 | 4-bit par-access shift register |
| 74LS197 | 14 | 4-bit binary counter |
| 74LS221 | 16 | Dual MS multivibrator schmitt trig. |
| 74LS240 | 20 | Octal buffer/line driver 3-st. |
| 74LS241 | 20 | Octal buffer/line driver 3-st. |
| 74LS242 | 14 | Quad bus transceiver |
| 74LS243 | 14 | Quad bus transceiver 3-st. |
| 74LS244 | 20 | Octal buffer 3-st. |
| 74LS245 | 20 | Octal bus transceiver 3-st. |
| 74LS247 | 16 | BCD/7 seg. decoder driver (o.c.) |
| 74LS251 | 16 | 8-channel mux 3-state |
| 74LS253 | 16 | Dual 4-to-1 data select/mux 3-st. |
| 74LS257 | 16 | Quad 2-input mux 3-st. |
| 74LS258 | 16 | Quad 2-to-1 mux 3-st. |
| 74LS259 | 16 | 8-bit addressable latch |

TABLE I-continued

| Industry No. | Pins | Logic Function |
|---|---|---|
| 74LS260 | 14 | Dual 5-input NOR gate |
| 74LS266 | 14 | Quad 2-IN XNOR gate (O.C.) |
| 74LS273 | 20 | Octal D flip-flop with clear |
| 74LS279 | 16 | Quad set/reset latch |
| 74LS280 | 16 | 9-bit odd/even parity gen/chkr |
| 74LS283 | 16 | 4-bit full adder |
| 74LS290 | 14 | Decade counter |
| 74LS293 | 14 | 4 Bit Binary Counter |
| 74LS299 | 20 | 8-bit univ. shift/storage register |
| 74LS322 | 20 | 8-bit shift register |
| 74LS365 | 16 | Hex buffer/driver 3-state |
| 74LS366 | 16 | Hex inverter/buffer 3-state |
| 74LS367 | 16 | Hex buffer/driver 3-state |
| 74LS368 | 16 | Hex inverter/buffer 3-state |
| 74LS373 | 20 | Octal transparent latch |
| 74LS374 | 20 | Octal dual flip-flop 3-state |
| 74LS375 | 16 | 4-bit bistable latch |
| 74LS377 | 20 | Octal D flip-flop W/com. enable |
| 74LS386 | 14 | Quad 2-input ex-OR-gate |
| 74LS390 | 16 | Dual 4-bit decade counter |
| 74LS393 | 14 | Dual 4-bit binary counter |
| 74LS395 | 16 | 4-Bit cascade, shift regis. 3-state |
| 74LS540 | 20 | Octal buffer/line driver 3-state |
| 74LS541 | 20 | Octal buffer/line driver 3-state |
| 74LS569 | 20 | BCD Decade Up/Down Synch. Counter |
| 74LS640 | 20 | Octal bus transceiver 3-state |
| 74LS670 | 16 | 4 × 4 register file 3-state |

The examples set forth in Table 1 are not exhaustive, but merely show some of the more common functional uses for the 74LS series of logic devices.

Figure 2:
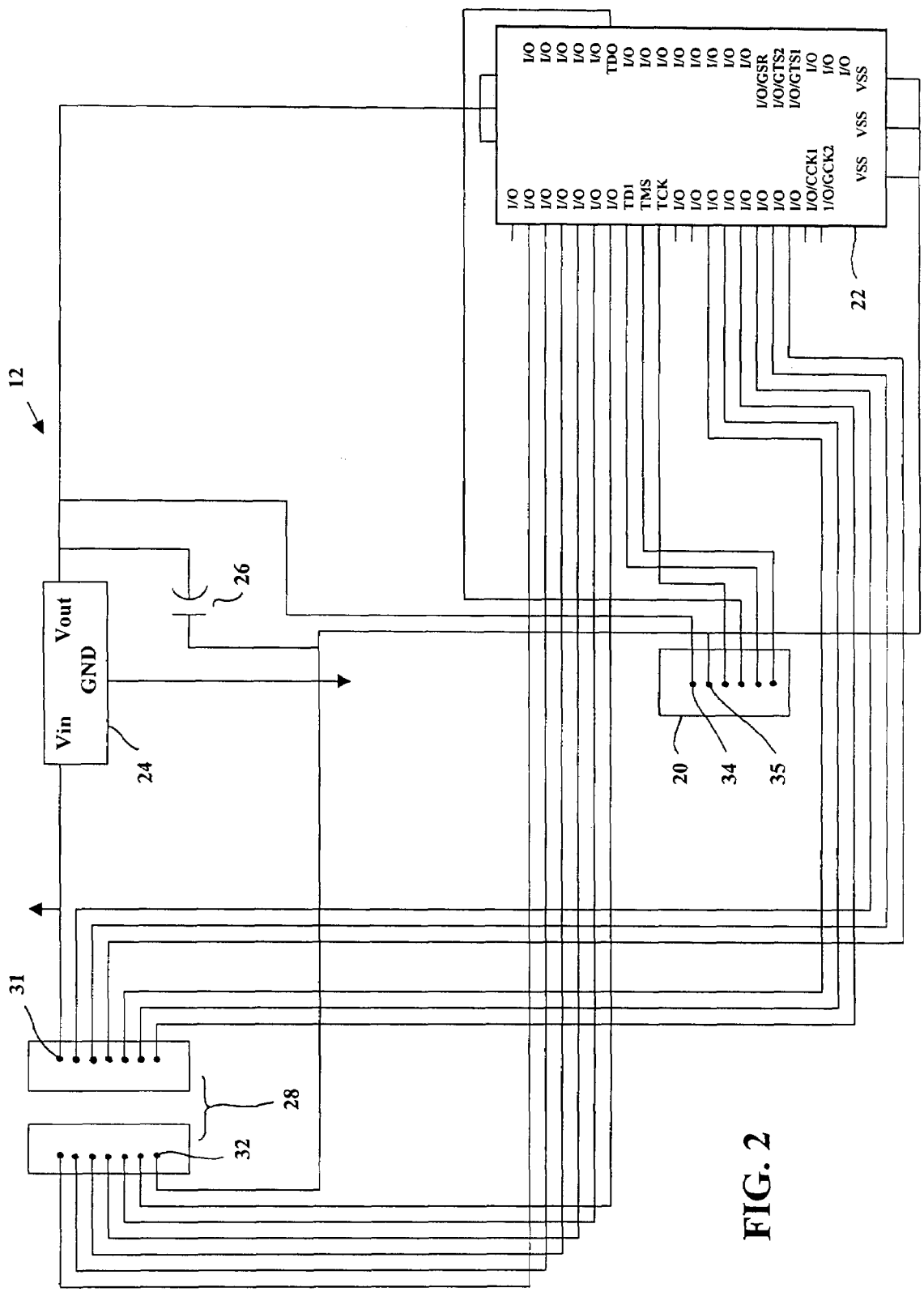
FIG. 2 is a schematic of an exemplary embodiment of the replacement assembly in accordance with the present invention.

Referring now to FIG. 2, it can be seen that the replacement device 12 includes a complex programmable logic device (CPLD) 22, such as the XC9500XL series CPLD manufactured by Xilinx of 2100 Logic Drive San Jose, Calif. The XC9500XL series CPLD can be programmed with most, but not all, of the logic functions contained in Table 1. For some of the more specialized logic functions, other CPLDs can be used.

The voltage input to the CPLD 22 is conditioned by a 3.3 volt voltage regulator 24 and a capacitor 26. A pin connector set 28 is provided. In the shown example, the pin connector set 28 has fourteen pins 18 (FIG. 1). However, it will be understood that a pin connector set 28 of sixteen pins or twenty pins can alternatively be used.

In the shown embodiment, the fourteenth pin 31 of the pin connector set 28 is coupled to the input of the voltage regulator 24. The seventh pin 32 of the pin connector set 28 is grounded and is joined to the ground of the voltage regulator 24, the ground of the capacitor 26 and the ground of the CPLD 22. The remainder of the pins in the pin connector set 28 are directly coupled to input/output ports of the yet unprogrammed CPLD 22.

The voltage regulator may be coupled to an external voltage source (not shown) or may receive power from a connection with the computer 14 (FIG. 1) that is used in programming. The use of an external power source depends upon the peripheral junction used in connecting to the computer and whether or not power is available through that peripheral junction.

A programming port 20 is provided that joins the replacement assembly 12 with the interface cable 16 (FIG. 1) that extends from the computer 14 (FIG. 1). The programming port 20 has a first pin receptacle 34 that is coupled to the output of the voltage regulator 24. A second pin receptacle 35 in the programming port 20 is grounded. The remaining pin receptacles lead to programming ports on the CPLD 22.

It will therefore be understood that logic functions can be programmed into the CPLD 22 through the programming port 20 and those logic functions can be utilized via the pin connector set 28.

The CPLD 22, voltage regulator 24, pin connector set 28 and programming port 20 are preferably manufactured in a single integrated package that is not much larger than the logic device being replaced. In this manner, when an obsolete logic device is removed from a circuit board, the replacement assembly 12 can be attached to that circuit board in the same location without any modifications to the circuit board.

Figure 3:
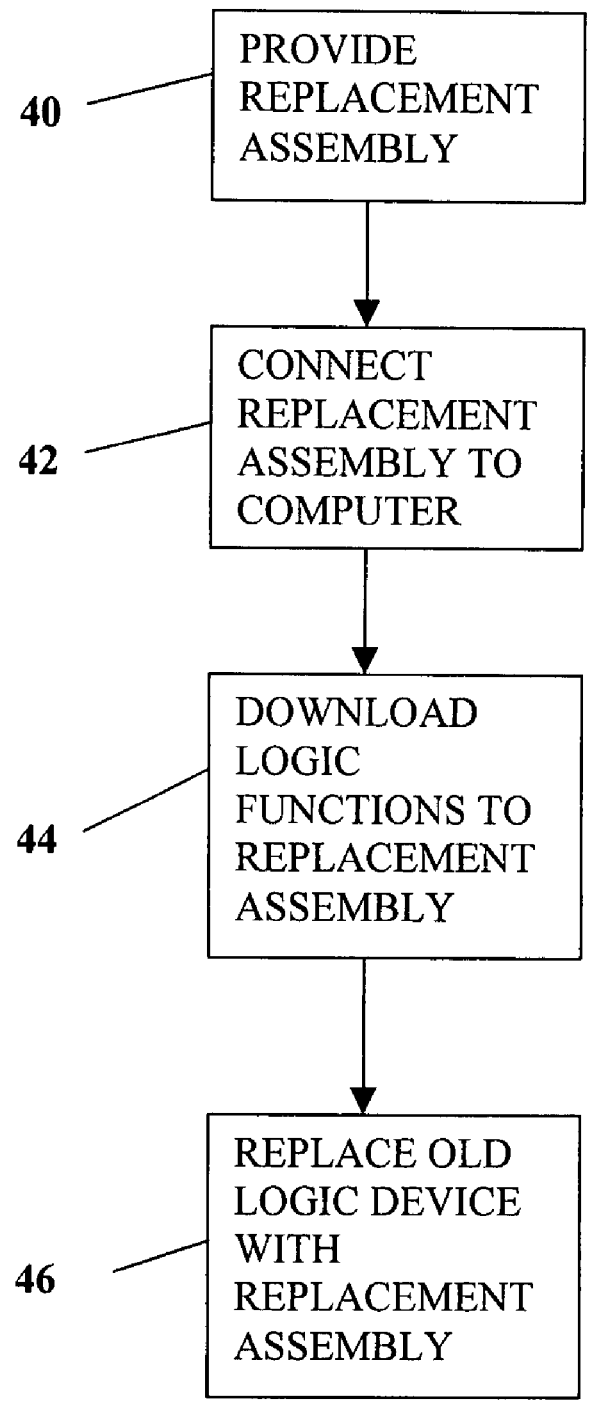
FIG. 3 is a block diagram illustration the logic flow of the method of producing a replacement logic device.

Referring now to FIG. 3 for methodology in conjunction with FIG. 1 for structure, the method of operation for the present invention will now be described. As is indicated by Block 40, a replacement assembly 12 is provided. The replacement assembly 12 includes a complex programmable logic device (CPLD). The replacement assembly 12 also has pins 18 in a configuration that mimics the pin configuration of a logic device that will be replaced by the replacement assembly 12. A programming port 20 is provided on the replacement assembly 12. The replacement assembly 12 is connected to a computer using the programming port 20. See Block 42.

Using Very High Speed Integrated Circuit Hardware Description Language (VHDL) the CPLD contained within the replacement assembly 12 is programmed with logic functions. Some of the logic functions are listed in Table 1. However, other logic functions can be had. The replacement device 12 is programmed with the logic functions of the logic device it is going to replace. See Block 44.

After programming, the replacement assembly 12 now has the same pin configuration and logic function programming as the logic device that is to be replaced. A defective logic device is then removed from an electronic assembly and the replacement assembly 12 is set into its place. See Block 46.

Thus, it will be understood that the replacement assembly 12 can be used to replace many obsolete logic devices. The replacement device 12 has standard components, but can be selectively programmed to match the logic function of hundreds of different obsolete logic devices. Obsolete logic devices, therefore, do not have to be remanufactured. Rather, by altering the programming of the replacement assembly 12, the replacement assembly 12 can be used to replace the obsolete logic device.

It will be understood that the embodiment of the present invention that is described and illustrated is merely exemplary and that a person skilled in the art can make many changes to the shown embodiment. For example, a 74LS series logic device was used throughout this specification as the example of the type of logic device being replaced. It should be understood that the technology of the present invention can be used to replace other types of logic devices, including those that have non-linear pin configurations and pin configurations with more than twenty pins or less than fourteen pins. All such alterations, variations and modifications are intended to be included within the scope of the present invention as set forth by the claims.

What is claimed is:

1. A method of creating a second replacement logic device to replace a first logic device having a preexisting pin configuration and a preexisting logic function, said method comprising the steps of:

providing a complex programmable logic device that is unprogrammed and is coupled to both a programming port and a pin configuration that mimics said preexisting pin configuration of said first logic device;

connecting said programming port to a computer;

regulating voltage received by said complex programmable logic device through said pin configuration; and programming a logic function into said complex programmable logic device that matches said preexisting logic function of said first logic device.

2. The method according to claim 1, wherein said complex programmable logic device, said pin configuration and said programming port are combined in a single integrated package.

3. The method according to claim 1, wherein said step of providing a complex programmable logic device includes providing an XC9500 series complex programmable logic device.

4. The method according to claim 1, wherein said step of programming a logic function into said complex programmable logic device includes downloading said logic function in Very High Speed Integrated Circuit Hardware Description Language.

5. A replacement assembly to replace an original logic device having a preexisting pin configuration and a preexisting logic function, said replacement assembly comprising:

a complex programmable logic device;

a programming port coupled to said complex programmable logic device;

a pin configuration coupled to said complex programmable logic device that mimics said preexisting pin configuration of said original logic device;

a voltage regulator that regulates voltage received by said complex programmable logic device; and wherein a logic function is programmed into said complex programmable logic device that matches said preexisting logic function of said original logic device.

6. The assembly according to claim 5, wherein said pin configuration contains a set of dual in-line pins.

7. The assembly according to claim 5, wherein said pin configuration is selected from a group consisting of fourteen pins, sixteen pins and twenty pins.

8. The assembly according to claim 5 wherein said programming port is a cable connection port.

9. The assembly according to claim 5, wherein said complex programmable logic device, said pin configuration and said programming port are in a single integrated package.

10. The assembly according to claim 5, wherein said complex programmable logic device is a XC9500 series complex programmable logic device.

11. A method of replacing a first logic device, having a first pin configuration and a first logic function with a substitute logic device, said method comprising the steps of:

providing an integrated package containing a complex programmable logic device that is coupled to both a programming port and a pin configuration that mimics said first pin configuration of said first logic device;

regulating voltage received by said complex programmable logic device through said pin configuration;

programming a logic function into said complex programmable logic device that matches said first logic function of said first logic device; and replacing said first logic device with said integrated package.

12. The method according to claim 11, wherein said step of programming a logic function into said complex programmable logic device includes attaching said programming port to a computer and downloading said logic function into said complex logic device from said computer.

* * * * *